United States Patent [19]

Buehler

[11] Patent Number: 6,011,698
[45] Date of Patent: Jan. 4, 2000

[54] CIRCUIT PROTECTION FROM RADIO FREQUENCY ENERGY

[75] Inventor: Ervin Roland Buehler, Galveston, Ind.

[73] Assignee: Delco Electronics Corp., Kokomo, Ind.

[21] Appl. No.: 08/748,223

[22] Filed: Nov. 12, 1996

[51] Int. Cl.[7] .............................. H05K 7/14; H01R 4/66
[52] U.S. Cl. ........................ 361/799; 361/752; 174/51; 439/108
[58] Field of Search .................................. 361/212, 220, 361/56, 111, 119, 752, 799; 343/741, 841; 235/492, 385; 174/51; 439/108

[56] References Cited

U.S. PATENT DOCUMENTS

| | | | |
|---|---|---|---|
| 5,111,199 | 5/1992 | Tomoda et al. | 340/825.72 |
| 5,321,240 | 6/1994 | Takahira | 235/380 |
| 5,428,214 | 6/1995 | Hakkers et al. | 235/492 |
| 5,598,032 | 1/1997 | Fidalgo | 257/679 |
| 5,612,532 | 3/1997 | Iwasaki | 235/492 |
| 5,627,552 | 5/1997 | Farrar et al. | 343/18 |

*Primary Examiner*—Leo P. Picard
*Assistant Examiner*—Jayprakash N. Gandhi
*Attorney, Agent, or Firm*—Jimmy L. Funke

[57] ABSTRACT

A hybrid circuit in a molded plastic housing has an antenna in the housing connected to the ground lead of the circuit for dissipating RF energy which is applied to the circuit due to electromagnetic interference, thereby increasing the degree of immunity of the circuit. Preferably the antenna is integral with the ground lead, is formed in a loop around the circuit and is embedded in the plastic housing.

10 Claims, 2 Drawing Sheets

CIRCUIT PROTECTION FROM RADIO FREQUENCY ENERGY

FIELD OF THE INVENTION

This invention relates to electronic circuit protection and particularly to means for enhancing immunity from electromagnetic interference (EMI).

BACKGROUND OF THE INVENTION

Automotive electronic circuits are subject to severe EMI due to noise from ignition circuits and many other sources on or off the vehicle. Hybrid electronic modules are produced typically with plastic molded packages. The plastic does not protect the internal electronic circuitry from external radio frequency (RF) energy. RF currents flow along the connecting harness to the hybrid module. Capacitive coupling between the module and its surroundings completes the path for the RF current flow.

Large hybrid components with metallic mounting plates can readily allow RF currents to flow through and away from the module to adjacent structures. Smaller modules without metallic plates will depend solely on capacitive coupling from its internal components for completion of the current path, thus all parts of the substrate become a radiator for RF energy.

Presently many small modules such as pressure transducers utilize capacitors and a grounded metallized back plane to control the flow of RF energy on the substrate of the module. The backplane and capacitors have a connection to the negative power lead (ground) at the connector. Such techniques afford limited immunity to electromagnetic interference (EMI); in some applications an incremental improvement in immunity is required.

The traditional techniques for improving such performance often carry severe cost penalties. It is also known to completely shield the front of the circuit as well as the backplane; this too is expensive to implement. Accordingly it is desired to improve the EMI (or RF) immunity at low cost and in keeping with conventional packaging and without increasing package size.

SUMMARY OF THE INVENTION

It is therefore an object of the invention to improve the RF immunity of an electronic circuit at low cost. Another object is to improve the RF immunity of an electronic circuit packaged in plastic.

The invention is carried out by incorporating an antenna in an electronic circuit assembly having a hybrid circuit with power and signal leads and a ground lead which is connected to the antenna. The antenna is mounted in or is embedded in the molded plastic packages and surrounds the circuit in an open loop or closed loop configuration. The antenna may comprise a foil or conductive paste inside the package or an extension of the ground lead which is molded within the plastic package. The antenna is in or above the plane of the circuit substrate.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
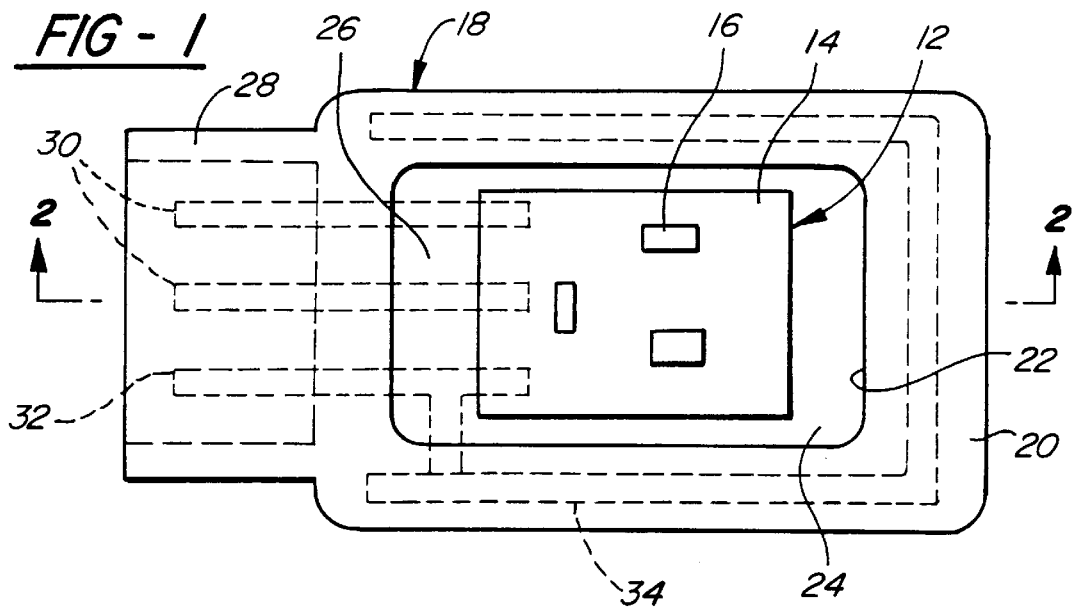
FIG. 1 is a plan view of a circuit package with improved immunity according to the invention.
Figure 2:
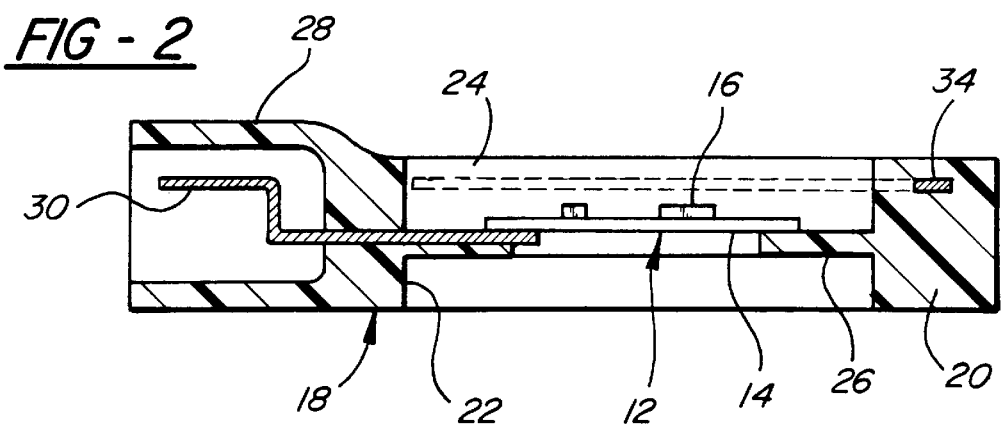
FIG. 2 is a cross section of the circuit package taken along line 2—2 of FIG. 1.

Referring to FIGS. 1 and 2, a hybrid circuit 12 comprising a substrate 14 and components 16 carried by the substrate is mounted in a molded plastic housing or package 18. The plastic package has a generally rectangular rim 20 with an inner wall 22 defining a well or cavity 24. A web 26 extending across the well supports the substrate 14. A connector shroud 28 at one end of the package and integral with the package contains the terminals of a pair of power and signal leads 30 and a ground lead 32. Portions of the leads are insert molded in the plastic package 18 and extend through the rim 20 and the web 26 to the circuit substrate 14. The ground lead has an extension which comprises a loop antenna 34 molded in the rim and surrounding three sides of the circuit 12, having an open side adjacent the shroud. The circuit also employs traditional techniques for controlling the flow of RF energy including a grounded metallized backplane and capacitors, not shown.

Figure 3:
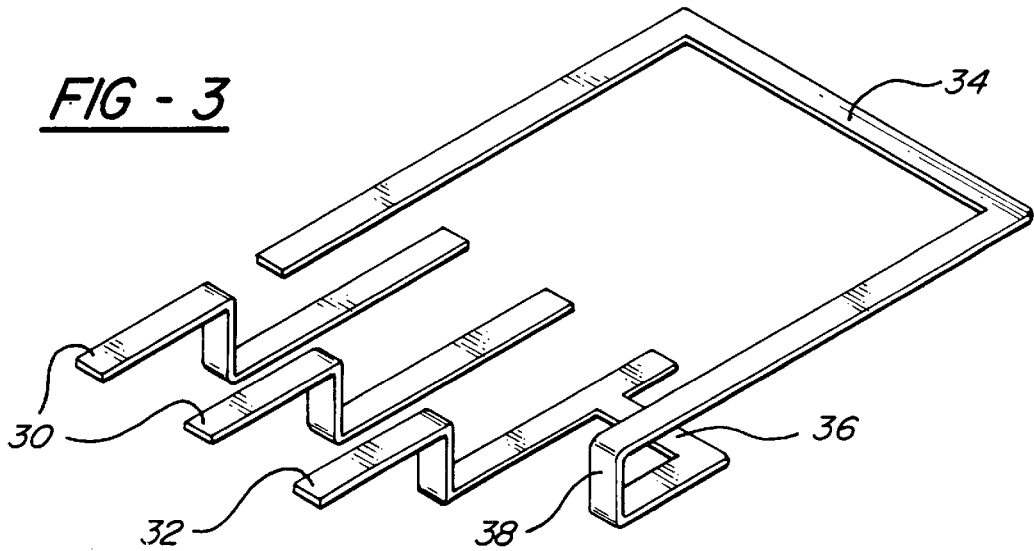
FIG. 3 is an isometric view of a lead arrangement including an antenna employed in the structure of the package of FIG. 1.
Figure 4:
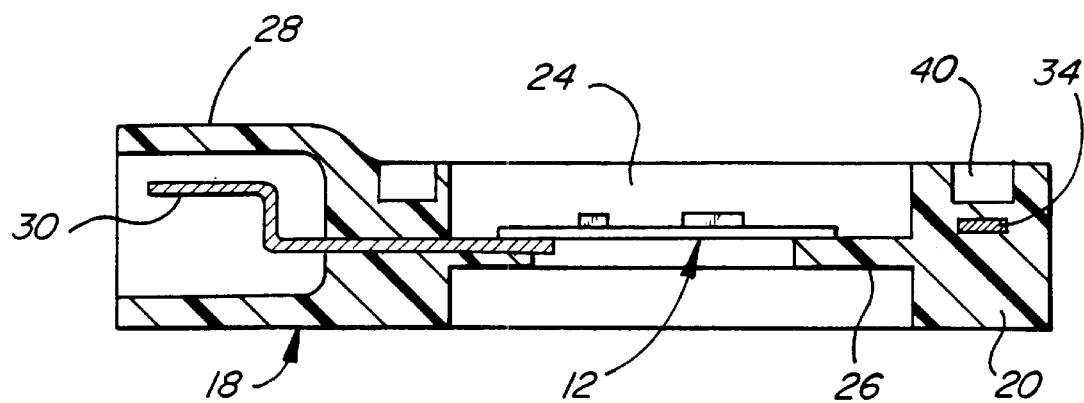
FIG. 4 is a cross section of a circuit package with improved immunity according to still another embodiment of the invention.

FIG. 3 illustrates the leads 30 and 32 and the antenna 34. These parts are stamped from sheet metal such as copper and formed to the desired shape, and then insert molded in the plastic package. The antenna loop is one piece with the ground lead 32; a lateral link 36 from the lead 32 and a vertical riser 38 connect the lead 32 to the antenna 34 which is in a plane above inner portion of the lead 32. Preferably the antenna 34 is in a plane a few millimeters above the circuit 12, as shown in FIG. 2. Packaging restraints sometimes do not allow room for the antenna in a plane above the circuit as in FIG. 4 where an upper trough 40 is provided in the rim to receive sealant and a cover, not shown. In that case the antenna may be located in the plane of the circuit 12. There the RF immunity performance is not as much improved as in the case where the antenna is above the circuit 12, but the improvement is sufficient for some applications. Trials with the antenna in the same plane with the inner portion of the lead 32 (below the substrate 14) revealed relatively little improvement in immunity. Thus it is important for the antenna to be in or above the plane of the circuit 12.

Figure 5:
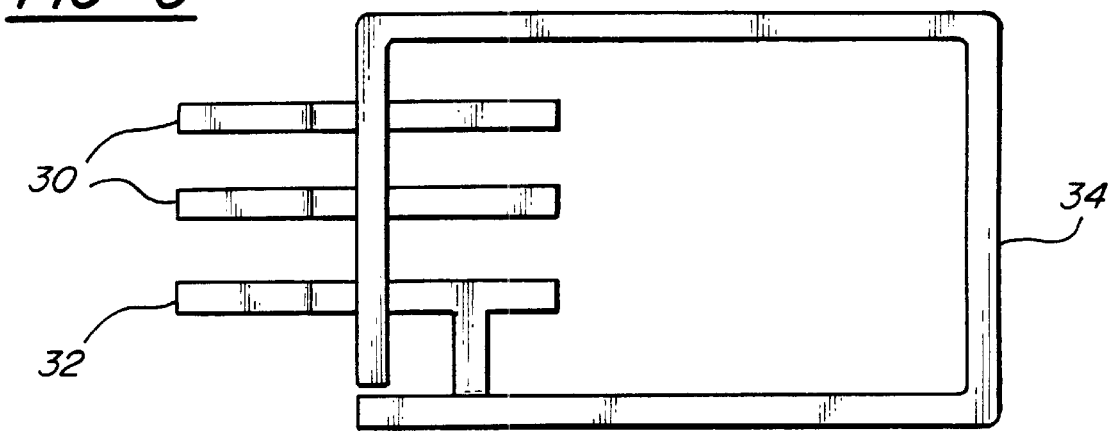
FIG. 5 is a plan view of an alternate antenna configuration and lead arrangement for use in a circuit package according to another embodiment of the invention.
Figure 6:
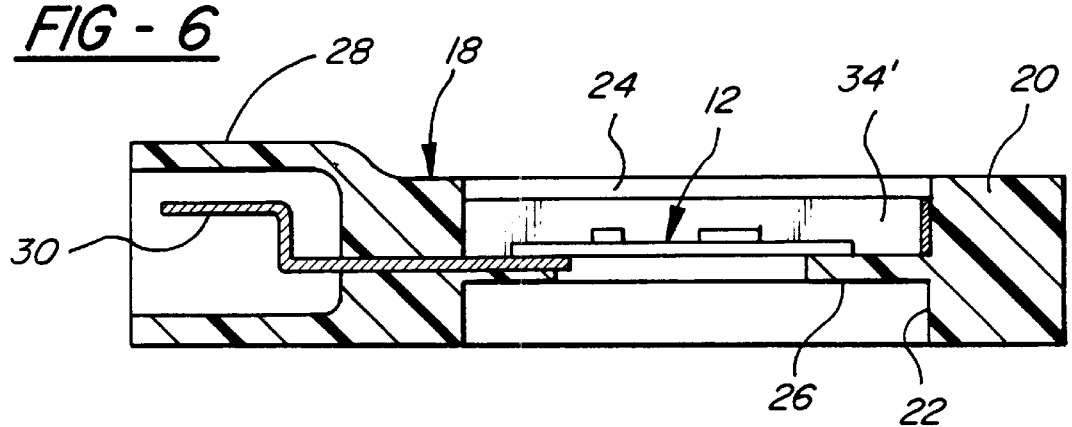
FIG. 6 is a cross section of a circuit package with improved immunity according to a further embodiment of the invention.

Another antenna configuration, as shown in FIG. 5, is a complete antenna loop. FIG. 6 shows an alternate construction where the antenna 34' is a foil or conductive paste applied to the inner wall 22 of the well 24, and connected to the ground lead. There, the antenna has a substantial vertical dimension and it extends from the plane of the substrate to a plane above the circuit. A grounded wire may be used as well, either along the wall 22 or molded in the rim.

In operation, RF currents induced in conductors coupled to the leads 30 and 32 flow to the circuit 12 and to the antenna 34. Emission from the antenna dissipates some of the RF energy, thereby reducing the amount available to enter the circuit. Depending on the antenna efficiency due to placement and other parameters, the circuit will thus be able to safely operate in EMI conditions which are too severe for operation without the antenna.

It will thus be seen that the improved immunity can be attained at little or no increase in cost of the circuit package and with no alteration in the package size. While the proposed structure does not eliminate the presence of EMI energy on the circuit, it can reduce such energy to acceptable levels in applications where the circuit could not otherwise be used without expensive alterations.

It will also be appreciated that many changes to the described circuit may be made within the spirit of the invention. For example, the antenna may be coupled to a fixed potential other than ground; as a practical matter, however, ground is generally the most convenient implementation of this requirement.

The embodiments of the invention in which an exclusive property or privilege is claimed are defined as follows:

1. In combination:
   a molded plastic housing;
   a circuit carried by a substrate mounted in the plastic housing;
   a plurality of leads including a ground lead extending through the housing and coupled to the circuit;
   an antenna electrically connected only to the ground lead, encapsulated in the plastic housing, and extending around the circuit perimeter, whereby radio frequency energy is at least partially dissipated by radiated emission from the antenna to reduce radio frequency energy in the circuit.

2. The invention as defined in claim 1 wherein the ground lead and the antenna are one piece.

3. The invention as defined in claim 1 wherein the leads and the antenna are formed from the same part, and the ground lead is integral with the antenna.

4. The invention as defined in claim 1 wherein the antenna comprises a U-shaped loop around the circuit.

5. The invention as defined in claim 1 wherein the antenna comprises a complete loop around the circuit.

6. The invention as defined in claim 1 wherein the antenna lies in the plane of the substrate.

7. The invention as defined in claim 1 wherein:
   the leads are attached to the circuit below the substrate; and
   the antenna lies above the plane of the substrate.

8. In combination:
   an insulating housing having an inner wall defining a well;
   a circuit;
   a substrate carrying the circuit and seated in the well of the housing;
   a plurality of leads including a ground lead extending through the housing and coupled to the circuit;
   a loop antenna electrically connected only to the ground lead and extending along the inner walls around the circuit within the housing well.

9. The invention as defined in claim 8 wherein the antenna comprises a foil strip along the wall.

10. The invention as defined in claim 8 wherein the antenna comprises a conductive paste along the wall.

* * * * *